(12) United States Patent
Stevenson

(10) Patent No.: US 6,399,903 B1
(45) Date of Patent: Jun. 4, 2002

(54) MULTIFUNCTIONAL LAMINATE STRUCTURE AND PROCESS

(75) Inventor: James F. Stevenson, Morristown, NJ (US)

(73) Assignee: Honeywell International Inc., Morris Township, NJ (US)

(*) Notice: Subject to any disclaimer, the term of this patent is extended or adjusted under 35 U.S.C. 154(b) by 0 days.

(21) Appl. No.: 09/500,957

(22) Filed: Feb. 15, 2000

Related U.S. Application Data

(60) Provisional application No. 60/122,186, filed on Mar. 1, 1999.

(51) Int. Cl.[7] .................. H01H 13/705; H01H 9/02; H05F 3/00; H05K 1/16
(52) U.S. Cl. .................. 200/5 A; 200/305; 200/512; 174/260; 361/212; 361/220
(58) Field of Search .................. 200/5 R, 5 A, 200/512–517, 304, 305, 86 R, 308–316; 361/212–220; 174/35 MS, 250–268; 455/500, 575, 90

(56) References Cited

U.S. PATENT DOCUMENTS

| | | | | |
|---|---|---|---|---|
| 4,303,960 A | * | 12/1981 | Sherwood et al. | 200/305 X |
| 4,336,529 A | * | 6/1982 | Buan | 200/5 A X |
| 4,456,800 A | * | 6/1984 | Holland | 361/212 |
| 4,737,883 A | * | 4/1988 | Hausler | 361/220 |
| 5,335,137 A | * | 8/1994 | English et al. | 361/220 |
| 5,557,079 A | * | 9/1996 | Jackson et al. | 200/5 A |
| 6,198,060 B1 | * | 3/2001 | Yamazaki et al. | 200/305 |

* cited by examiner

Primary Examiner—J. R. Scott
(74) Attorney, Agent, or Firm—Roger H. Criss

(57) ABSTRACT

A multilayered structural element which is useful for forming housings for electronic devices such as cellular telephones. The multilayered structural element has sequentially attached layers:

(a) thin, flexible polymeric outer film layer,
(b) an electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer.

23 Claims, 2 Drawing Sheets

MULTIFUNCTIONAL LAMINATE STRUCTURE AND PROCESS

CROSS REFERENCE TO RELATED APPLICATION

This application claims the benefit of provisional patent application Ser. No. 60/122,186 filed Mar. 1, 1999, which is incorporated herein by reference.

BACKGROUND OF THE INVENTION

1. Field of the Invention

The present invention pertains to multilayered structural elements which are useful for forming housings for electronic devices such as cellular telephones.

2. Description Of The Related Art

It is well known in the art that housings for electronic devices, such as cellular telephones, which are made of plastics, are becoming progressively thinner as the overall size of these devices decrease. Electronic device manufacturers seek housing space reductions to contribute to an overall reduction in the size of electronic devices as demand increases for smaller sizes of such devices.

Current cellular telephone housings are manufactured by a series of manufacturing steps requiring injection molding, individual manufacturing operations and final assembly. This technique has several drawbacks.

The housings lose stiffness as the walls become thinner. These can be reinforced, such as with fiber glass only to a limited extent because of glass breakage, an increase in viscosity, and appearance issues. Injection molds can be filled very quickly at higher pressures and/or melt temperatures to prevent premature solidification, but these conditions can cause appearance and degradation problems. In addition, modified injection molding machines are very costly.

Certain surfaces of the housing must be coated with an EMI shielding material in a secondary operation. Decorated surfaces require placing a preformed plastic film in the injection mold and filling the mold behind the film without distortion or degradation of the film. Soft touch surfaces on the device may require two-step molding and the associated tool expense. Current electronic devices are not shaped to conform to the user's hand. The keypads, which are relatively thick, are molded separately and assembled by aligning with holes in the cover of the housing. Assembly of the covers and internal components requires the use of screws or other fasteners. The current design with air gaps between the internal components and the housing is not suited for removing heat generated internally. An external antenna is assembled as a separate step and requires threaded inserts causing local stress concentrations and cracks. Current antennas have no directionality, and exposure of the user's head to high frequency radiation is of increasing concern.

It would be beneficial to produce a housing for electronic devices that has a thin, tough, stiff, decorated, shielded, and compact, shaped housing. For example, such a housing could be used to produce cellular telephones as thin as two thick credit cards, that can be carried in a shirt pocket. To this end, the invention provides thin, a multilayered structural element for electronic circuitry having a thin, flexible polymeric outer film layer, an optional electronic interface layer having a pattern of electrically conductive lines; a rigid structural layer; an electromagnetic interference shielding layer; and an optional protective layer.

The related art describes a variety of housings for electronic devices, however, the multifunctional structural element of this invention is not suggested. U.S. Pat. Nos. 4,227,037; 5,520,976; 5,700,342; 5,804,762; 5,595,801 and 5,819,16 EMI shielded enclosure for electronic devices. U.S. Pat. No. 5,837,086 shows a method of injection molding plastics for electrical shielding. U.S. Pat. No. 6,005,191 shows a heat shrinkable sheathing for coaxial cables. U.S. Pat. No. 4,678,699 shows an EMI/RFI shielding composite, however, such does not have an electronic interface layer having a pattern of electrically conductive lines. U.S. Pat. No. 3,931,094 shows a filled thermoplastic composition for forming shaped articles.

The present invention solves a multitude of problems associated with injection molding operations and related secondary operations, assembly and manufacturing processes by providing a new structure and processing for thin electronic and other housings. The structure comprises a multifunctional laminate in which each thin layer of laminated material performs one or more of the following functions: stiff impact resistant covering, decorated/soft touch external surfaces, transparent screen cover, integral key pad, EMI shielding, thermal management, and internal antenna. The design of the electronic device integrates internal electronic components and a reinforced housing which simultaneously provides and a heat conduction path for the electronic components. A process for manufacturing the housing according to the present invention comprises a continuous lamination line in which various layers are brought together, bonded, and shaped to produce an assembled housing section substantially in its final form. Alternatively the housing can be manufactured by stacking the various layers as discrete pieces, obtaining the proper registration among layers, and shaping the assembled layers between the surfaces of a heated tool. The present invention overcomes the limitations and problems associated with the injection molding process because the new design uses a continuous fiber reinforced laminate which is very tough, stiff, and thin. Additionally, the external surface of the housing may be covered by a decorative layer of an aesthetic material, and an integral conductive film layer provides EMI shielding.

SUMMARY OF THE INVENTION

The invention provides a multilayered structural element for attachment to electronic circuitry which comprises as sequentially attached layers:
 (a) thin, flexible polymeric outer film layer,
 (b) an electronic interface layer, the electronic interface layer comprising a thin, flexible polymeric film layer having a pattern of electrically conductive lines on at least one side thereof;
 (c) a rigid structural layer;
 (d) an electromagnetic interference shielding layer; and
 (e) an optional protective layer.

The invention also provides an electronic device which comprises an electronic circuit element and the above structural element attached on a side of the circuit element, such that the circuit element is attached to the electromagnetic interference shielding layer or the protective layer; and the conductive lines of the electronic interface layer form an electric connection with the circuit element.

The invention further provides an electronic device which comprises as sequentially attached elements:
 i) a first multilayered structural element which comprises as sequentially attached layers:
  (a) a thin, flexible polymeric outer film layer,
  (b) an electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer;

ii) an electronic circuit element attached to the electromagnetic interference shielding layer or the protective layer of the first multilayered structural element wherein the conductive lines of the electronic interface layer forms an electric connection with the circuit element; and iii) a second multilayered structural element, which comprises as sequentially attached layers:
(a) a thin, flexible polymeric outer film layer,
(b) an optional electronic interface layer, the electronic interface layer comprising a thin, flexible polymeric layer having a pattern of electrically conductive lines on at least one side thereof;
(c) a rigid structural layer;
(d) an electromagnetic interference shielding layer; and
(e) an optional protective layer;

the circuit element being attached to the electromagnetic interference shielding layer or the protective layer of the second multilayered structural element.

The invention still further provides a telephone which comprises a first telephone half hingedly and electrically connected to a second telephone half, each telephone half comprising as sequentially attached elements:

i) a first multilayered structural element, which comprises as sequentially attached layers:
(a) a thin, flexible polymeric outer film layer,
(b) an electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer attached;

ii) an electronic telephone circuit element attached to the electromagnetic interference shielding layer or the protective layer of the first multilayered structural element, wherein the conductive lines of the electronic interface layer forms an electric connection with the telephone circuit element; and iii) a second multilayered structural element, which comprises as sequentially attached layers:
(a) a thin, flexible polymeric outer film layer,
(b) an optional electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer;

the telephone circuit element being attached to the electromagnetic interference shielding layer or the protective layer of the second multilayered structural element.

The invention still further provides a process for producing a multilayered structural element for attachment to electronic circuitry which comprises continuously or discretely attaching as sequential layers:
(a) a thin, flexible polymeric outer film layer,
(b) an optional electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer.

The invention still further provides a process for producing an electronic device which comprises producing first and second multilayered structural elements by continuously attaching as sequential layers:
(a) a thin, flexible polymeric outer film layer,
(b) an optional electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer; and attaching the first and second multilayered structural element on opposite sides of an electronic circuit element, such that the circuit element is attached to the electromagnetic interference shielding layer or the protective layer of each structural element; wherein at least one electronic interface layer is present and the conductive lines of the electronic interface layer form an electric connection with the circuit element.

The invention still further provides a process for producing an electronic device which comprises producing first and second multilayered structural elements by continuously or discretely attaching as sequential layers:
(a) a thin, flexible polymeric outer film layer,
(b) an optional electronic interface layer, the electronic interface layer comprising a thin, flexible polymeric film layer having a pattern of electrically conductive lines on at least one side thereof,
(c) a rigid structural layer;
(d) an electromagnetic interference shielding layer; and
(e) an optional protective layer; and attaching the first and second multilayered structural element on opposite sides of a circuit element, such that the circuit element is attached to the electromagnetic interference shielding layer or the protective layer of each structural element; wherein at least one electronic interface layer is present and the conductive lines of the electronic interface layer form an electric connection with the circuit element.

The invention still further provides a process for producing a telephone which comprises i) forming first and second telephone halves, each telephone half being produced by producing first and second multilayered structural elements by continuously or discretely attaching as sequential layers:
(a) a thin, flexible polymeric outer film layer,
(b) an optional electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer; and ii) attaching the first and second multilayered structural element on opposite sides of a telephone circuit element, such that the telephone circuit element is attached to the electromagnetic interference shielding layer or the protective layer of each structural element; wherein at least one electronic interface layer is present and the conductive lines of the electronic interface layer form an electric connection with the telephone circuit element;

iii) hingedly and electrically connecting the first and second telephone halves.

DETAILED DESCRIPTION OF THE PREFERRED EMBODIMENT

Figure 1:
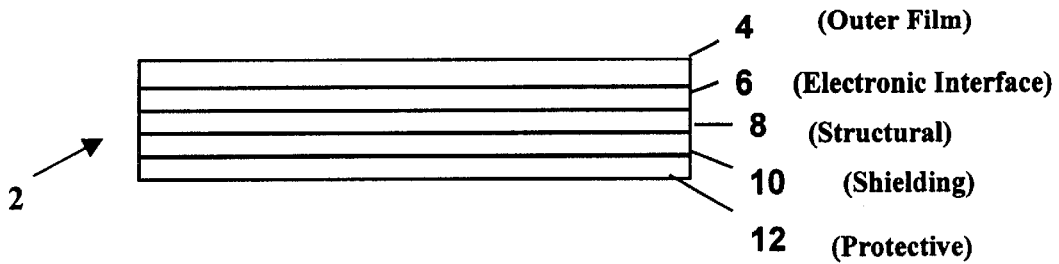
FIG. 1 shows a schematic representation of a multilayered structural element according to the invention.

The multilayered structural element of the present invention is suitable for attachment to electronic circuitry to form an electronic device such as a cellular telephone. It comprises as sequentially attached layers:

(a) thin, flexible polymeric outer film layer, (b) an optional but preferred electronic interface layer, the electronic interface layer comprising a thin, flexible polymeric film layer having a pattern of electrically conductive lines on at least one side thereof;

(c) a rigid structural layer;

(d) an electromagnetic interference shielding layer; and (e) an optional but preferred protective layer.

The outer film layer comprises a thin, flexible polymeric, preferably decorated film preferably having a transparent area to cover the screen and printed keys in a keypad area. The remaining area, is preferably printed with a color or decoration. Printing may be on the innerside of the outer film layer to prevent wear. The outer film layer should be composed of a material which is scratch resistant, compatible for bonding to the other layers, formable, and preferably flexible enough to be rollable on long rolls. Suitable materials nonexclusively include plastics and elastomers such as nylons, polycarbonates, thermoplastic elastomers, thermoplastic polyesters, polyolefins, polyurethanes, polyvinyl chloride, acrylonitrile-butadiene-styrene polymers, polyoxyalkylenes, polystyrene, liquid crystal polymers, and copolymers and blends thereof The most preferred materials are Santoprene®, a thermoplastic elastomer commercially available from Advanced Elastomer Systems located in Akron, Ohio, and Capron® nylon 6 available from Honeywell International Inc., of Morristown, N.J. The outer surface of the outer film layer may be continuous, discontinuous, embossed, raised or perforated or may have one or more sections having one or more of these properties. In one use, the outer film layer forms a keypad having a plurality of indicia visible at an outer surface thereof and a plurality of electrically conductive contacts at an inner surface thereof which correspond to the indicia. Such can form depressible keys which contact suitable circuitry on the next layer. The structural the outer film layer may form a visible display having at least one display element capable of being activated electronically or thermally. Such a display elements may be, for example, light emitting diodes, a liquid crystal display elements or optical fibers.

Attached to the outer film layer is an optional but preferred electronic interface layer. The electronic interface layer comprising a thin, flexible polymeric film layer having a printed circuit, i.e. a pattern of electrically conductive lines on at least one side thereof. The film portion may comprise any of the materials listed above as suitable for the outer film layer. The conductive lines form an electrical connection with the functional circuitry of the device to be formed. The conductive lines may cooperate with any electrically conductive contacts at an inner surface of the outer film layer. For example, the outer film layer may comprise a keypad with a number on the outer surface and an electrical contact on the inner surface. When the number is depressed, the electrical contact touches a suitable portion of the electrically conductive lines which may comprise pressure sensitive switches which close the circuit upon the application of the external pressure. The closing of the circuit may be indicated by a tactile or an audible signal to give feedback to the user. Only the layer portion under the keypad has printed circuits to convey the signal when a key is pressed. The lines then in turn cooperate with the circuitry of the overall device to effect some function such as initiating a telephone call. This layer may contain one or more circuits such as circuitry for a keypad, circuitry for an antenna, circuitry for issuing a tactile signal, circuitry for issuing a visible signal, and circuitry for issuing an audible signal. Suitable materials for the metal contacts and metal lines nonexclusively include aluminum, aluminum alloys, copper, copper alloys, titanium, tantalum, and tungsten.

The next layer is a thin, rigid structural layer which serves to prevent the multilayered structural element from bending and thereby breaking the circuitry of the overall device. It is preferably composed of a fiber reinforced polymer composition such as a woven or nonwoven web of glass fibers, carbon fibers, thermoplastic fibers or combinations thereof impregnated with a polymeric material. Preferred polymeric materials include nylons, polycarbonates, thermoplastic elastomers, thermoplastic polyesters, polyolefms, polyurethanes, polyvinyl chloride, acrylonitrile-butadiene-styrene polymers, polyoxyalkylenes, polystyrene, liquid crystal polymers, and copolymers and blends thereof. Such a fiber reinforced polymer compositions are readily commercially available. One suitable fiber reinforced polymer is a continuous fiber reinforced nylon 6 commercially available from Applied Fiber Systems located in Clearwater, Fla. Preferably the rigid structural layer has a flexural modulus of from about 3,000 MPa to about 100,000 MPa. In use, this layer is cut out in the screen area for forming the front shell of a screen housing or forming an electronic device.

Next the multilayered structural element has an electromagnetic interference (EMI) shielding layer. The trend toward higher frequency device operation requires improved shielding, especially along seams. See, for example, *Plastics for Portable and Wireless Electronics,* 4th Annual Conference, SPE, Mesa, Ariz. Jan. 25–26, 1999. The layer is electrically conductive to provide EMI shielding and is preferably thermally conductive to spread heat and provide temperature uniformity over the layer surface. This layer may comprises a metal foil such as aluminum or a metalized polymer film such as the nylon film. A means of distributing heat uniformly helps prevent interior hot spots and regions which feel hot to the user.

Next the structure comprises an optional but preferred protective layer which may comprise a foamed polymer such as a cellular urethane. This serves to protect the functional circuitry which forms the overall device. One preferred material is sold under the tradename PORON by Rogers Corporation located in Rogers, Connecticut.

The layers are sequentially attached to one another as indicated above. They may be attached with a suitable adhesive such as a thermally activated or pressure sensitive adhesive or they may be attached by a snap fit, thermal bonding, welding, or the like. Such techniques are well known in the art.

In the formation of an electronic device, an electronic circuit element, such as a telephone circuit element or display panel circuit element is attached on at least one side with the multilayered structural element. Circuit elements may comprise the electronics of the device such as telephone electronics, keypad electronics, screen display electronics and battery. Preferably the electronic circuit element is sandwiched between two of the multilayered structural elements and the composite attached with a suitable adhesive such as a thermally activated or pressure sensitive adhesive, or they may be attached by a snap fit, thermal bonding, welding, or the like. A preferred attachment medium is a thin pad or adhesive layer optimized to provide both support to the housing so that it feels firm to the user and to cushion the electronics from impact if the device is dropped. This adhesive may be thermally conductive to move heat from power sources to the EMI shielding layer, if desired. Thin conductive pads or conductive elastic adhesives provide a continuous heat transmission path between the internal heat sources and the housing cover. Such connecting adhesive material provide a better transfer path than natural convection across an internal air gap. In one preferred embodiment, an electronic device comprises an electronic circuit element which is attached on one side with the multilayered structural element. In another embodiment, an electronic circuit element may be attached on both sides side with the multilayered structural element. In the latter case, each of the multilayered structural elements may have an electronic interface layer or only one may have an electronic interface layer, however, at least one of the multilayered structural elements must have an electronic interface layer.

In the production of a telephone device, there are two preferred possible constructions. These are of the hinged (flip) design, and the monolithic "candy bar" design. The most preferred embodiment is the hinged design since it is more compatible with a shirt-pocket size cellular telephone. In the latter case, a telephone comprises a first telephone half hingedly and electrically connected to a second telephone half wherein each telephone half comprises a telephone circuit element sandwiched between the multilayered structural elements described above.

One design for the housing is four shells—screen and keypad housing sections, each of which consists of a front and back shell as shown in FIG. 1. The two back shells are joined by a polymer hinge, as shown. As part of the continuous manufacturing process, the edges of each shell are curved to form the cavity for the electronics. This materials and process are selected to insure that the curved sections have an acceptable aesthetic appearance (no distortion of decoration or wrinkling).

The circuit element is attached to the electromagnetic interference shielding layer or the protective layer, if one is present; and the conductive lines of at least one of the electronic interface layers form an electric connection with the circuit element. The thusly formed device is preferably edge sealed by attaching a suitable molding attached around an outer peripheral edge of the circuit element and the structural elements. Suitable molding include any of the polymer compositions listed above as suitable for the outer film layer. The moldings may also be attached with a suitable adhesive such as a thermally activated or pressure sensitive adhesive, or they may be attached by a snap fit, thermal bonding, welding, or the like. Preferably the edge of the device comprises a continuous band of soft-touch material which covers the joint where the upper and lower structural elements meet. A soft touch provided by an external soft band surrounding the device, having recessed areas on the edges, may correspond to the shape of the user's hand allowing for a better grip or more comfortable. The most preferred electronic device is a telephone such as a cellular telephone. The circuit elements, including panel circuit element and telephone circuit elements are well known in the art. When the electronic device is a cellular telephone, the electronic interface layer may comprise an antenna or a discrete antenna may be incorporated into one of the internal layers of the housing so that it is directed away from the user and includes two layers of EMI shielding between the antenna and the user's head.

Figure 2:
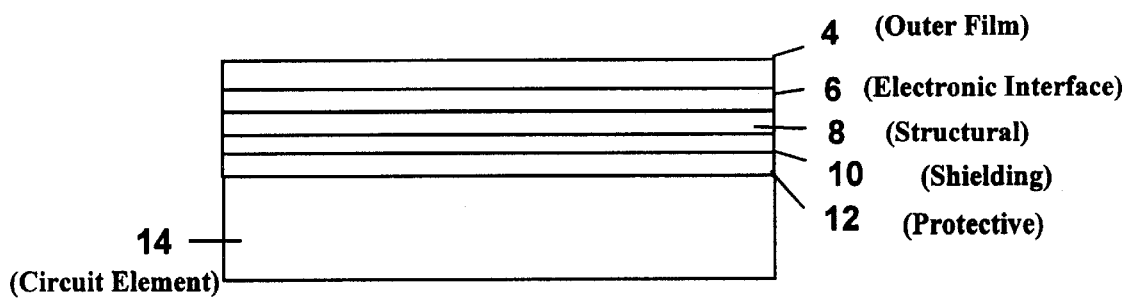
FIG. 2 shows the multilayered structural element of FIG. 1 attached to an electronic circuit element.
Figure 3:
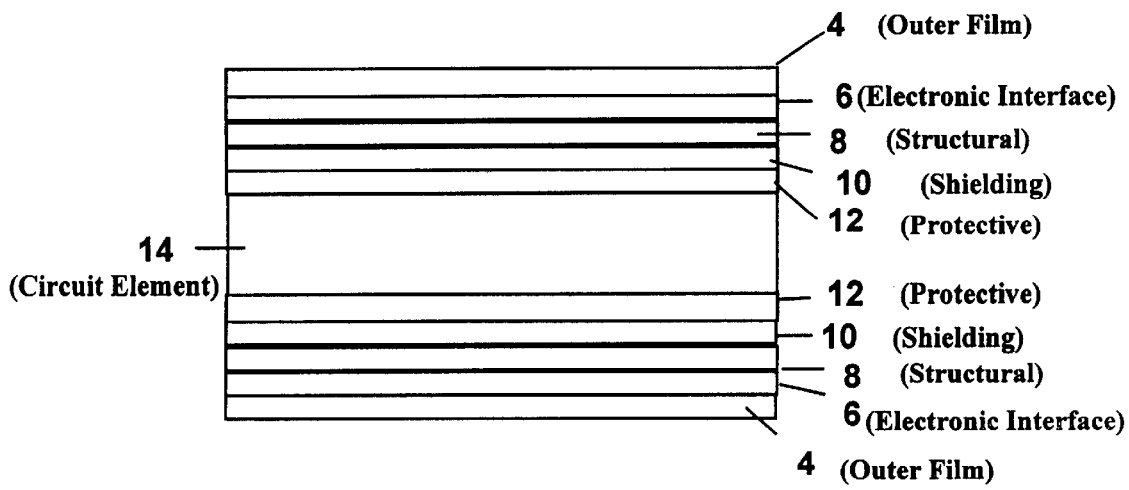
FIG. 3 shows the multilayered structural element of FIG. 1 attached to each side of an electronic circuit element.

Referring to FIG. 1, there is shown a schematic representation of a multilayered structural element 2. It has a thin, flexible polymeric outer film layer 4, an electronic interface layer 6, a rigid structural layer 8; an electromagnetic interference shielding layer 10 and a protective layer 12. FIG. 2 shows the multilayered structural element 2 attached to an electronic circuit element 14. FIG. 3 shows the multilayered structural element 2 of FIG. 1 attached to each side of to an electronic circuit element 14.

Figure 4:
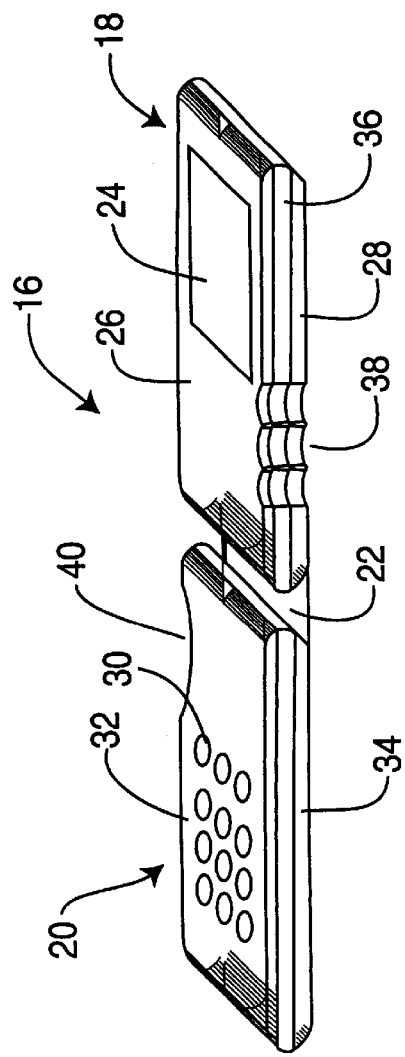
FIG. 4 shows a schematic representation of a hinged telephone according to the invention.

FIG. 4 shows a schematic representation of a hinged telephone 16. It is shown to have a first and second telephone halves 18 and 20 respectively which are connected by a hinge 22. The first telephone half 18 comprises a display screen 24. The first telephone half 18 has upper and lower multilayered structural elements 26 and 28 which sandwich a telephone display circuit, not shown. The upper element 26 has a cutout, i.e. to accommodate the display screen 24. The second telephone half 20, comprises a keypad 30. The second telephone half 20 has upper and lower multilayered structural elements 32 and 34 which sandwich a telephone keypad circuit, not shown. The upper element 32 has a cutout surface to accommodate depressible keypad buttons. In an alternate design, both the screen display and keypad are on one of the telephone halves.

When producing a multilayered structural element and the electronic device, the layering may be produced by continuously or discretely attaching the sequential layers. In a typical discrete manufacturing process, the individual layers may be provided as pieces of their material and the pieces aligned and attached by any means described above. The outline of the device may then be stamped out in a press punch operation and the final contour established by pressing between heated die halves.

In a continuous manufacturing process, each of the layers may be provided to a series of stations along the line in the form of a roll of the material. The materials are unrolled, attached sequentially, and stamped out in a press punch operation to the desired shape. In one embodiment, upper and lower multilayered structural elements are unrolled, attached sequentially, and the circuit elements art sandwiched between upper and lower multilayered structural elements. Then the sandwich is sealed, and the device stamped out in a press punch operation to the desired shape. Then an edge sealing band 36 is attached around the periphery to form the final product. Optionally the electronic device may have a hand contour such as shown at 38 and 40.

Figure 5:
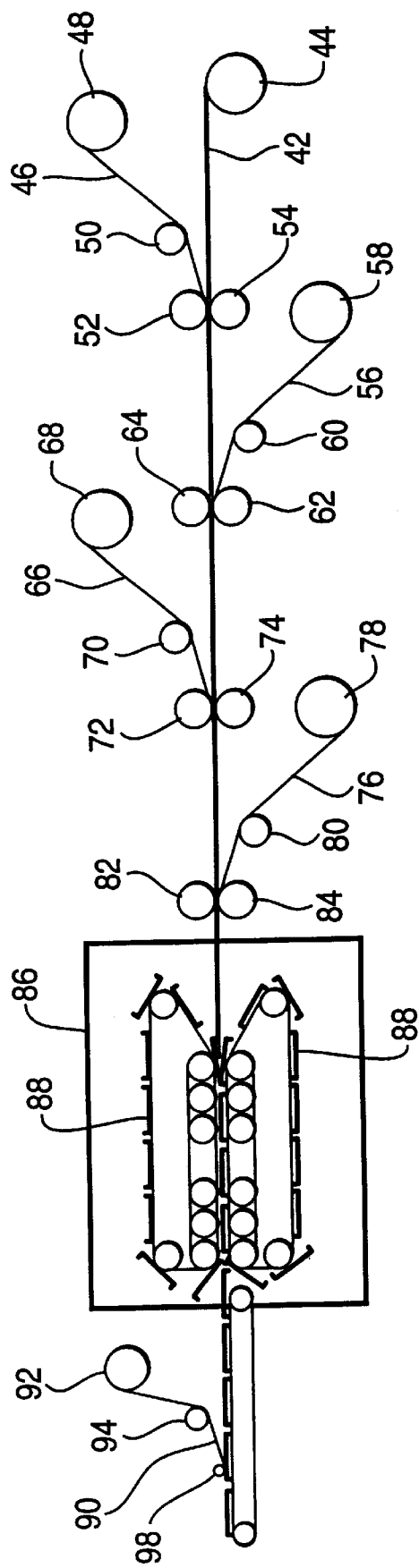
FIG. 5 shows a preferred continuous sequence for the production of electronic devices according to the invention.

FIG. 5 shows a preferred continuous sequence production line for forming multilayered structural elements according to the invention. Beginning at the right side of FIG. 5, a powder impregnated continuous fiber layer which forms a rigid structural layer 42 is unwound from roll 44. A layer of the electronic interface layer material 46 unwinds from roll 48 and is aligned with the structural layer material by registration roller 50. The electronic interface layer material presses together with the structural layer material via application roller 52 and backup roller 54. The electromagnetic interference shielding layer/heat transfer layer 56 unwinds from roll 58 and is aligned with the structural layer material by registration roller 60. The electromagnetic interference shielding layer/heat transfer layer material presses together with the structural layer material via application roller 62 and backup roller 64.

The thin, flexible polymeric outer film layer material 66 unwinds from roll 68 and is aligned with the structural layer material by registration roller 70. The thin, flexible polymeric outer film layer material 66 presses together with the electronic interface layer material 46 via application roller 72 and backup roller 74. The protective layer material 76 unwinds from roll 78 and is aligned with the electromagnetic interference shielding layer/heat transfer layer 56 by registration roller 80. The protective layer material 76 presses together with the electromagnetic interference shielding layer/heat transfer layer 56 via application roller 82 and backup roller 84. The combined strip then may transfer into a thermal shaping chamber 86 which comprises upper and lower continuous form shaping punches 88. A surface decoration material 90 maybe unwound from a material roll 92, aligned by a registration roller 94 and applied to the surface of the shaped multilayered structure 96 by application roller 98. Suitable trim operations may follow. The result is a multilayered structural element which may then be attached to a suitable circuit element. Two mirror production lines such as is shown in FIG. 5 may simultaneously produce upper and lower multilayered structural elements which are then continuously or discretely attached on opposite sides of a circuit element and the entire assembly attached together followed by application of an edge sealing band.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A multilayered structural element for attachment to electronic circuitry which comprises as sequentially attached layers:
    (a) thin, flexible polymeric outer film layer,
    (b) an electronic interface layer, the electronic interface layer comprising a thin, flexible polymeric film layer having a pattern of electrically conductive lines on at least one side thereof;
    (c) a rigid structural layer;
    (d) an electromagnetic interference shielding layer; and
    (e) an optional protective layer.

2. The structural element of claim 1 wherein the protective layer is present.

3. The structural element of claim 1 wherein the outer film layer comprises a material selected from the group consisting of nylons, polycarbonates, thermoplastic elastomers, thermoplastic polyesters, polyolefins, polyurethanes, polyvinyl chloride, acrylonitrile-butadiene-styrene polymers, polyoxyalkylenes, polystyrene, liquid crystal polymers, and copolymers and blends thereof.

4. The structural element of claim 1 wherein an outer surface of the outer film layer has one or more sections which are continuous, discontinuous, embossed, raised or perforated.

5. The structural element of claim 1 wherein the outer film layer comprises a keypad having a plurality of indicia visible at an outer surface thereof and a plurality of electrically conductive contacts at an inner surface thereof which correspond to the indicia.

6. The structural element of claim 1 wherein the outer film layer comprises a visible display comprising at least one display element capable of being activated electronically or thermally.

7. The structural element of claim 1 wherein the outer film layer comprises a visible display comprising at least one display element capable of being activated electronically or thermally and which comprises a light emitting diode, a liquid crystal display element or an optical fiber.

8. The structural element of claim 1 wherein the electronic interface layer comprises one or more circuits selected from the group consisting of circuitry for a keypad, circuitry for an antenna, circuitry for issuing a tactile signal, circuitry for issuing a visible signal, and circuitry for issuing an audible signal.

9. The structural element of claim 1 wherein the rigid structural layer comprises a fiber reinforced polymer composition.

10. The structural element of claim 1 wherein the rigid structural layer comprises a woven or nonwoven web comprising glass fibers, carbon fibers, thermoplastic fibers, or combinations thereof.

11. The structural element of claim 1 wherein the rigid structural layer comprises glass or carbon fibers impregnated with a polymeric material.

12. The structural element of claim 1 wherein the rigid structural layer comprises glass or carbon fibers impregnated with a polymeric material selected from the group consisting of nylons, polycarbonates, thermoplastic elastomers, thermoplastic polyesters, polyolefins, polyurethanes, polyvinyl chloride, acrylonitrile-butadiene-styrene polymers, polyoxyalkylenes, polystyrene, liquid crystal polymers, and copolymers and blends thereof.

13. The structural element of claim 1 wherein the rigid structural layer has a flexural modulus of from about 3,000 MPa to about 100,000 MPa.

14. The structural element of claim 1 wherein the electromagnetic interference shielding layer comprises a metal foil or a metalized polymer film.

15. The structural element of claim 1 wherein the protective layer comprises a foamed polymer.

16. An electronic device which comprises an electronic circuit element and the structural element of claim 1 attached on a side of the circuit element, such that the circuit element is attached to the electromagnetic interference shielding layer or the protective layer; and the conductive lines of the electronic interface layer form an electric connection with the circuit element.

17. The electronic device of claim 16 further comprising a molding attached around an outer peripheral edge of the circuit element and the structural elements.

18. The electronic device of claim 16 which is a telephone and the circuit element comprises a telephone circuit element.

19. The electronic device of claim 16 which is a display panel.

20. An electronic device which comprises as sequentially attached elements:
    i) a first multilayered structural element which comprises as sequentially attached layers:
        (a) a thin, flexible polymeric outer film layer,
        (b) an electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer;

ii) an electronic circuit element attached to the electromagnetic interference shielding layer or the protective layer of the first multilayered structural element wherein the conductive lines of the electronic interface layer forms an electric connection with the circuit element; and iii) a second multilayered structural element, which comprises as sequentially attached layers:
(a) a thin, flexible polymeric outer film layer,
(b) an optional electronic interface layer, the electronic interface layer comprising a thin, flexible polymeric layer having a pattern of electrically conductive lines on at least one side thereof;
(c) a rigid structural layer;
(d) an electromagnetic interference shielding layer; and
(e) an optional protective layer;

the circuit element being attached to the electromagnetic interference shielding layer or the protective layer of the second multilayered structural element.

21. The electronic device of claim 20 which is a telephone and the circuit element comprises a telephone circuit element.

22. The electronic device of claim 20 which is a display panel.

23. A telephone which comprises a first telephone half hingedly and electrically connected to a second telephone half, each telephone half comprising as sequentially attached elements:

i) a first multilayered structural element, which comprises as sequentially attached layers:
(a) a thin, flexible polymeric outer film layer,
(b) an electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer attached;

ii) an electronic telephone circuit element attached to the electromagnetic interference shielding layer or the protective layer of the first multilayered structural element, wherein the conductive lines of the electronic interface layer forms an electric connection with the telephone circuit element; and iii) a second multilayered structural element, which comprises as sequentially attached layers:
(a) a thin, flexible polymeric outer film layer,
(b) an optional electronic interface layer, the electronic interface layer comprising a thin, flexible polymeric film layer having a pattern of electrically conductive lines on at least one side thereof;
(c) a rigid structural layer;
(d) an electromagnetic interference shielding layer; and
(e) an optional protective layer;

the telephone circuit element being attached to the electromagnetic interference shielding layer or the protective layer of the second multilayered structural element.

* * * * *